United States Patent [19]
Gal

[11] Patent Number: 4,749,885
[45] Date of Patent: Jun. 7, 1988

[54] NONSATURATING BIPOLAR LOGIC GATE HAVING A LOW NUMBER OF COMPONENTS AND LOW POWER DISSIPATION

[75] Inventor: Laszlo V. Gal, Poway, Calif.
[73] Assignee: Unisys Corporation, Detroit, Mich.
[21] Appl. No.: 15,382
[22] Filed: Feb. 17, 1987
[51] Int. Cl.⁴ .............. H03K 19/088; H03K 19/086; H03K 19/082; H03K 19/013
[52] U.S. Cl. ..................... 307/454; 307/455; 307/456
[58] Field of Search .................. 307/454, 455, 456
[56] References Cited
U.S. PATENT DOCUMENTS
3,450,896 6/1969 Taniguchi et al. ............ 307/454

Primary Examiner—Stanley D. Miller
Assistant Examiner—David R. Bertelson
Attorney, Agent, or Firm—Charles J. Fassbender; L. Joseph Marhoefer

[57] ABSTRACT

A two input nonsaturating bipolar logic gate consists of just two bipolar transistors plus a pair of resistors plus two voltage buses. One resistor has a resistance $R_C$ and it is connected from one of the voltage buses to the collector of both transistors. The second resistor has a resistance $R_E$ and it is connected from the other voltage bus to the emitter of both transistors. Those resistances $R_C$ and $R_E$ are selected such that $R_C/R_E>1$ and $0.1<(V_{CC}-V_{BE})R_C/R_E<0.8\ V_{BE}$ where $V_{BE}$ is the base to emitter voltage at which each transistor turns on and $V_{CC}$ is the voltage between the two voltage buses.

10 Claims, 4 Drawing Sheets

Fig. 3 eq. 1 ~ if $V_{i1} \cdot V_{i2} = V_{OL}$, T11·T12 OFF eq. 2 ~ ∴ $V_{OH} = V_{CC}$ eq. 3 ~ if $V_{i1}/V_{i2} = V_{OH}$, T11/T12 ON eq. 4 ~ ∴ $V_{OL} = V_{CC} - I_C R_C$ eq. 5 ~ $I_C \cong I_E$ $$I_E = \frac{V_E}{R_E} = \frac{V_{CC} - V_{BE}}{R_E}$$

eq. 6 ~ $V_{OL} = V_{CC} - [V_{CC} - V_{BE}]\frac{R_C}{R_E}$ eq. 7a ~ $V_{OL} < V_{BE}$ eq. 7b ~ $R_C/R_E > 1$ eq. 8a ~ $V_f < 0.8 V_{BC}$ eq. 8b ~ $(V_{CC} - V_{BE})\frac{R_C}{R_E} < 0.8 V_{BE}$ eq. 9a $V_{OH} - V_{OL} > 0.1$ eq. 9b $(V_{CC} - V_{BE})\frac{R_C}{R_E} > 0.1$

Fig. 5 eq. 1   $S_2 \approx 2T + 2R + 2V$ eq. 2   $S_1 \approx 5T + 4R + 4V$ eq. 3   $S_2 < \frac{1}{2} S_1$

Fig. 6 eq. 1   $P_2 \approx V_{CC} I_O (\frac{1}{2})$ eq. 2   $P_1 \approx V_{EE} I_O + V_{EE} (\frac{I_O + 0.8 I_O}{2})$, $V_{EE} > 2 V_{CC}$ eq. 3   $P_2 < \frac{1}{7} P_1$

Fig. 7 eq. 1   $T_{D2} \approx T_{ON}/T_{OFF}$ of (T11 or T12)

eq. 2   $T_{D1} \approx T_{ON}/T_{OFF}$ of (T1 or T2) + (T5)

eq. 3   $T_{D2} \approx T_{D1}$

NONSATURATING BIPOLAR LOGIC GATE HAVING A LOW NUMBER OF COMPONENTS AND LOW POWER DISSIPATION

BACKGROUND OF THE INVENTION

This invention relates to logic gate circuitry; and more particularly, it relates to those logic gate circuits that are made of nonsaturating bipolar transistors.

In the prior art, bipolar transistors are used to make both $T^2L$ logic circuits and ECL logic circuits $T^2L$ logic circuits consume less power the ECL logic circuits; however, $T^2L$ logic circuits operate at a slower speed since their bipolar transistors are interconnected such that they saturate. By comparison, ECL logic circuits operate at a high speed; but they consume a large amount of power since their bipolar transistors are interconnected such that they do not saturate.

All of the circuitry of a conventional ECL logic gate is shown in FIG. 1. It receives two high or low input signal $V_{i1}$ and $V_{i2}$; then the left-hand portion of the gate forms a signal $S_1$ of an intermediate voltage which represents the logical NOR of the input signals; and then the right-hand portion of the gate restores the voltage level of signal $S_1$ to the high and low input signal levels. This gate has a switching speed of about 0.4 nanoseconds, a power dissipation of about 10 milliwatts, and it is commercially available in the MCA II gate array series from Motorola.

One problem, however, with the FIG. 1 ECL logic gate is that it includes a large number of components. Specifically, it includes five transistors T1, T2, T3, T4, and T5; four resistors R1, R2, R3, and R4; and four voltage buses B1, B2, B3, and B4. Each of these components occupies a certain amount of space on a semiconductor chip; and thus they limit the number of gates that can be integrated into the chip.

Another problem with the FIG. 1 ECL logic gate is that it consumes too much power. That power which is dissipated in the left-hand portion of the FIG. 1 gate can be expressed as $V_{EE} I_0$, and that power which is dissipated in the right-hand portion of the FIG. 1 gate can be expressed as $(\frac{1}{2})(I_0+0.8I_0)V_{EE}$.

Current $I_0$ in the left-hand term is a constant current which always flows through either transistor T1, T2, or T3; and it is generated by the current source which is formed by the combination of transistor T4 and resistor R3. In the right-hand term, the current $\frac{1}{2}(I_0+0.8I_0)$ is the average current which flows through transistor T5. Current $I_0$ flows when the output signal $V_0$ is high, and current 0.8 $I_0$ flows when the output $V_0$ signal is low.

Accordingly, in an effort to overcome the above problem, a primary object of the invention is to provide an improved nonsaturating bipolar logic gate which operates at essentially the same speed as an ECL logic gate but which requires substantially fewer components and dissipates substantially less power.

BRIEF SUMMARY OF THE INVENTION

With the present invention, a two input nonsaturating bipolar logic gate consists of just two bipolar transistors plus a pair of resistors plus two voltage buses. One resistor has a resistance $R_C$ and it is connected from one of the voltage buses to the collector of both transistors. The second resistor has a resistance $R_E$ and it is connected from the other voltage bus to the emitter of both transistors. Those resistance $R_C$ and $R_E$ are selected such that $R_C/R_E > 1$ and $0.1 < (V_{CC}-V_{BE})R_C/R_E < 0.8V_{BE}$ where $V_{BE}$ is the base to emitter voltage at which each transistor turns on a $V_{CC}$ is the voltage between the two voltage buses.

BRIEF DESCRIPTION OF THE DRAWINGS

Various features and advantages of the invention are described in the Detailed Description in conjunction with the accompanying drawings wherein:

FIG. 3 includes a set of equations which impose constraints on the FIG. 2 logic gate;

FIG. 5 shows a comparison of the space that is occupied by the logic gates of FIGS. 1 and 2;

FIG. 6 shows a comparison of the power that is dissipated by the logic gates of FIGS. 1 and 2; and FIG. 7 shows a comparison of the time delay through the logic gates of FIGS. 1 and 2.

DETAILED DESCRIPTION OF THE INVENTION

Figure 2:
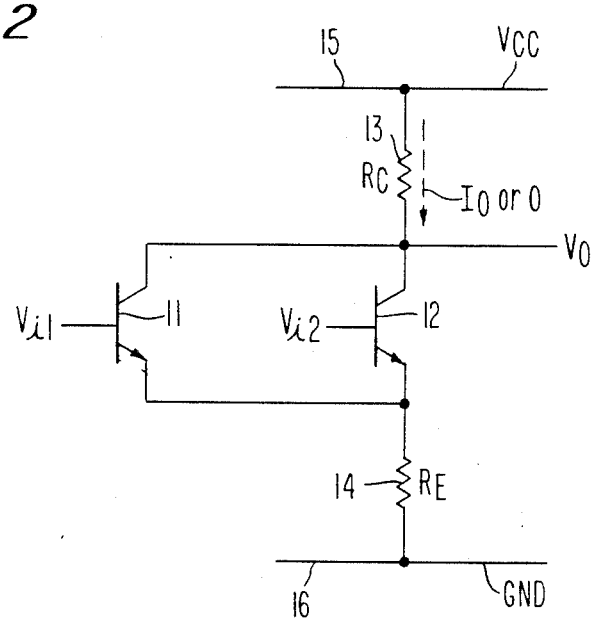
FIG. 2 illustrates a preferred embodiment of a logic gate that is constructed in accordance with the invention.

Referring now to FIG. 2, a preferred embodiment of the invention will be described in detail. This embodiment is a two-input logic gate which is made of just two transistors 11 and 12 plus two resistors 13 and 14. Both of the transistors 11 and 12 have their collectors coupled through resistor 13 to a bus 15 which carries a voltage $V_{CC}$, and both of the transistors have their emitters coupled through resistor 14 to a bus 16 which is at ground. In operation, input signals $V_{i1}$ and $V_{i2}$ are applied to conductors on the base of transistors 11 and 12, and an output signal $V_0$ is generated on a conductor from the collectors of those transistors.

Also in the FIG. 2 logic gate, certain constraints are placed on the resistors 13 and 14. Those constraints are developed by a set of equations which are shown in FIG. 3. Beginning with equation 1, it says that if both of the input signals are at a low logic level $V_{0L}$, then both of the transistors 11 and 12 are turned off. Consequently, as stated by equation 2, the output signal will be at a high voltage level $V_{OH}$ which equals $V_{CC}$.

Next, equation 3 states that if one of the input signals is at the high voltage level $V_{OH}$, then the corresponding transistor will turn on. Thus, as stated by equation 4, the output signal will be at the low voltage $V_{0L}$. Voltage $V_{0L}$ equals the bus voltage $V_{CC}$ minus the voltage drop across resistor 13. In equation 4, the term $R_C$ is the resistance of resistor 13 and $I_C$ is the collector current.

Equation 5 then says that when one of the transistors is on, the collector current $I_C$ is approximately equal to the emitter current $I_E$, and the emitter current is equal to the emitter voltage $V_E$ divided by the resistance $R_E$ of resistor 14. However, the emitter voltage $V_E$ is equal to the base voltage minus $V_{BE}$, where $V_{BE}$ is the base to emitter drop which occurs when the transistor is on. By virtue of equation 2, the base voltage equals $V_{CC}$. So substituting equation 5 into equation 4 yields equation 6.

Equation 7a says that the low level output voltage $V_{0L}$ must be less than $V_{BE}$. This constraint insures that transistors 11 and 12 in the FIG. 2 logic gate do not turn on when their input signals are low. Inspection of equation 6 shows that to meet this constraint, the ratio of the resistances $R_C$ and $R_E$ must be greater than one, and this constraint is stated by equation 7b.

Equation 8a says that the maximum forward voltage, $V_f$, across the base to collector junction in transistors 11 and 12 must be less than $(0.8)(V_{BC})$ where $V_{BC}$ is the base to collector turn-on voltage. This constraint of equation 8a keeps the transistors 11 and 12 from going into saturation; and that in turn makes the switching speed of those transistors fast.

By symmetry, $V_{BC}$ equals $V_{BE}$. And for a silicon transistor, $V_{BE}$ is 0.7 volts; for a germanium transistor, $V_{BE}$ is 0.3 volts; and for a gallium arsenide transistor, $V_{BE}$ is 0.9 volts. Also, voltage $V_f$ equals the collector current $I_C$ times resistance $R_C$, and the collector current $I_C$ can be expressed in terms of equation 5. Consequently, the constraint of equation 8a can be rewritten as equation 8b.

Equation 9a states that the difference between the two output voltage level $V_{OH}$ and $V_{OL}$ must be greater than 0.1 volts. This constraint of equation 9a ensures that the swing of the output voltage will be larger than the amount of noise which typically occurs in an integrated circuit chip. Both of the voltage levels in equation 9a are given by equation 2 and equation 6. Thus, the constraint of equation 9a and can be rewritten as equation 9b.

Figure 4:
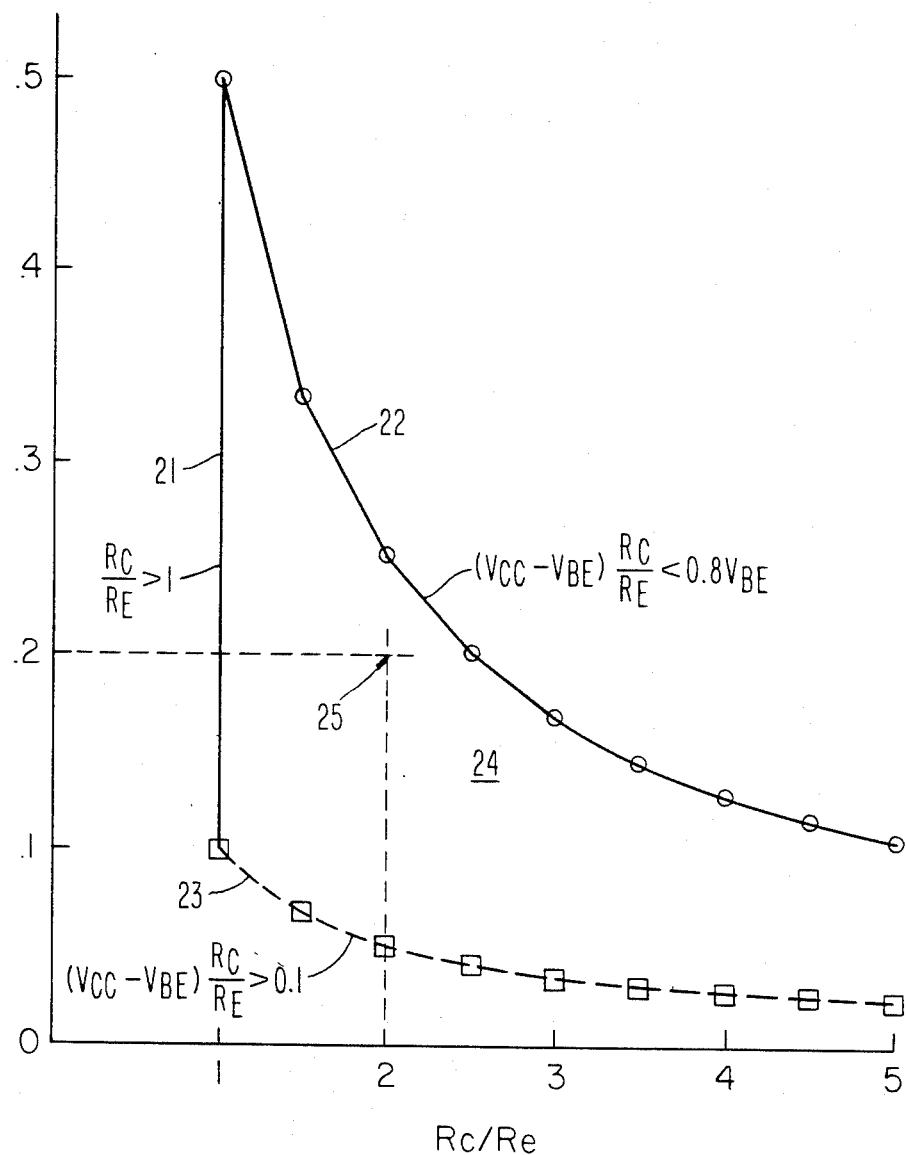
FIG. 4 is a plot of the constraint equations in FIG. 3.

Turning now to FIG. 4, it contains respective plots of the equations 7b, 8b, and 9b for the case where silicon transistors are used (i.e., $V_{BE}$ is 0.7 volts). Curve 21 is a plot of equation 7b; curve 22 is a plot of equation 8b; and curve 23 is a plot of equation 9b. These three plots form the boundary of an area 24; and in order for the FIG. 2 logic gate to operate properly, the parameters $R_C$, $R_E$, $V_{CC}$ and $V_{BE}$ must be chosen to lie within that area.

For example, suppose that the desired operating point in FIG. 4 is given by reference numberal 25. In that case, suitable values for $R_C$, $R_E$, and $V_{CC}$ respectively are 200 ohms, 100 ohms, and 0.9 volts.

One important feature of the FIG. 2 logic gate is that the chip space which is occupied by the gate is small. This is evident from equations 1, 2, and 3 in FIG. 5. Equation 1 says that the chip space $S_2$ which the FIG. 2 gate occupies is equal to the space 2T that is occupied by two transistors plus the space 2R that is occupied by two resistors plug the space 2V that is occupied by two voltage buses. By comparison, equation 2 says that the space $S_1$ which is occupied by the FIG. 1 logic gate is equal to the space 5T of five transistors plus the space 4R of four resistors plus the space 4V of four voltage buses. Comparing equation 1 and equation 2 yields equation 3 which says that the FIG. 2 logic gate occupies less than half the space of the FIG. 1 logic gate.

Another important feature of the FIG. 2 logic gate is that the amount of power which it dissipates is small. This is evident by inspection of equations 1, 2 and 3 in FIG. 6. Equation 1 says that the power P2 which the FIG. 2 logic gate dissipates is equal to the voltage $V_{CC}$ across the gate $V_{CC}$ times the average current $\frac{1}{2}I_C$ through the gate. This average current is arrived at by assuming that the output voltage is at $V_{OL}$ and at $V_{OH}$ for equal time durations.

Figure 1:
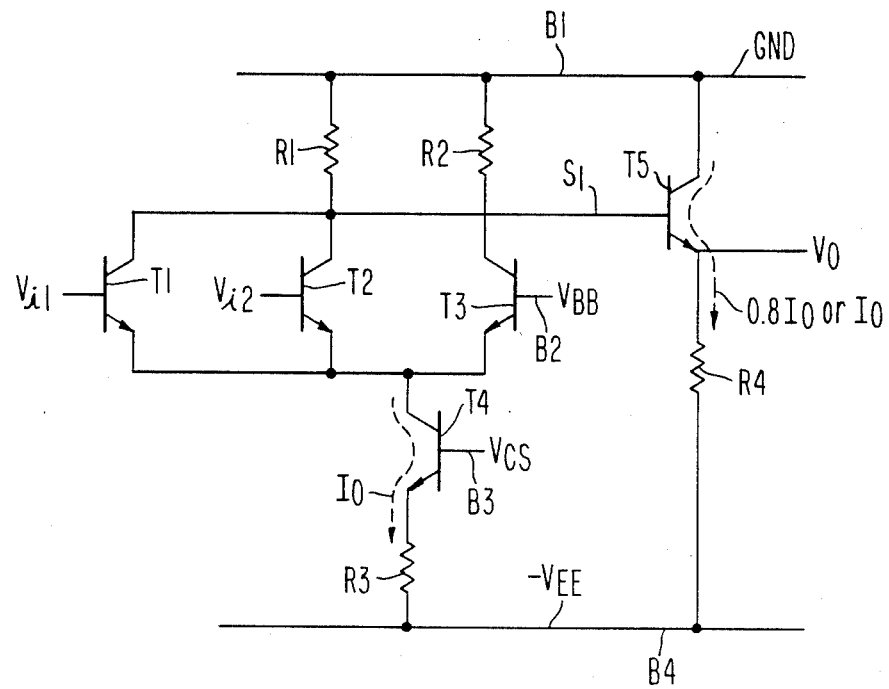
FIG. 1 illustrates, for comparison purposes, an ECL logic gate of the prior art.

By comparison, equation 2 in FIG. 6 gives an expression for the power P1 which is dissipated by the FIG. 1 logic gate. In that equation, the left-hand term gives the power that is dissipated in components R1, R2, R3, T1, T2, T3, and T4; and the right-hand term gives the power that is dissipated in components R4 and T5.

Equation 2 also says that the voltage $V_{EE}$ is about two times the voltage $V_{CC}$.

In the FIG. 1 circuit, transistors T3 and T4 are stacked on top of one another (i.e. they are serially) connected between the $V_{EE}$ and ground voltage buses). Thus in the FIG. 1 circuit, $V_{EE}$ must be at least twice $V_{BE}$ to ensure that both of the serially connected transistors can turn on. But in the FIG. 2 circuit, $V_{CC}$ can be less than twice $V_{BE}$. In fact, FIG. 4 shows $V_{CC}$ can nearly equal $V_{BE}$. Comparing then equation 1 with equation 2 in FIG. 6 yields equation 3 which says that the power dissipation of the FIG. 2 circuit is less than one-seventh of the power dissipation in the FIG. 1 circuit.

Even though the power dissipation of the FIG. 2 logic gate is substantially less than that of the FIG. 1 logic gate, the speed of operation of the two gates is substantially the same. This is evident from equations 1, 2, and 3 of FIG. 7. Equation 1 says that the time delay $TD_2$ thru the FIG. 2 logic gate is equal to the turn-on time or turn-off time of transistor 11 (or transistor 12). By comparison, equation 2 says that the time delay $TD_1$ thru the FIG. 1 logic gate is approximately equal to the turn-on or turn-off time of one of the transistors T1 and T2 in the differential pair plus some additional delay which is caused by transistor T5. If one assumes the delay through transistor T5 is relatively small since it is always on, then comparing equation 1 with equation 2 yields equation 3 which says that the time delays thru the FIG. 1 and FIG. 2 logic gates are nearly equal.

A preferred embodiment of the invention has now been described in detail. In addition, however, many changes and modifications can be made to these details without departing from the nature and spirit of the invention. For example, the transistors 11 and 12 in the FIG. 2 circuit are shown as NPN transistors; but they can also be PNP transistors. In that case, the voltage $V_{CC}$ would be negative instead of positive.

Accordingly, it is to be understood that the invention is not limited to just one embodiment but is defined by the appended claims.

What is claimed is:

1. An improved N input logic gate which consists of just N bipolar transistors having respective bases for receiving two level input signals, plus a pair of resistors, plus two voltage buses;

a first resistor of said pair having a resistance $R_C$ and being connected from one of said voltage buses to the collector of all N transistors for generating output signals thereon;

a second resistor of said pair having a resistance $R_E$ and being connected from the remaining voltage bus to the emitter of all N transistors; and wherein to reduce power dissipation in said gate and to generate said output signals with the same two levels as said input signals, the improvement comprises said resistance $R_C$ and $R_E$ being selected such that $R_C/R_E > 1$ and $0.1 < (V_{CC} - V_{BE})R_C/R_E < 0.8 V_{BE}$ where $V_{BE}$ is the base to emitter voltage at which each transistor turns on and $V_{CC}$ is the voltage between said two voltage buses.

2. A logic gate according to claim 1 wherein said transistors are NPN transistors.

3. A logic gate according to claim 1 wherein said transistors are PNP transistors.

4. A logic gate according to claim 1 wherein said transistors are silicon transistors.

5. A logic gate according to claim 1 wherein said transistors are germanium transistors.

6. A logic gate according to claim 1 wherein said transistors a gallium arsenide transistors.

7. A logic gate according to claim 1 wherein said voltage $V_{CC}$ is less than $2V_{BE}$.

8. An integrated circuit which includes a plurality of N input logic gates that are interconnected to each other without any level shifters between the gates; wherein each logic gate consists essentially of:

N bipolar transistors, which are of a single conductivity type throughout said integrated circuit;

said transistors having collectors that are connected through a first resistor of resistance $R_C$ to a first voltage bus;

said transistors having emitters that are connected through a second resistor of resistance $R_E$ to a second voltage bus; and said resistance $R_C$ and $R_e$ being selected such that $R_C/R_E > 1$ and $0.1 < (V_{CC} - V_{BE})R_C/R_E < 0.8V_{BE}$ where $V_{BE}$ is the base to emitter voltage at which each transistor turns on and $V_{CC}$ is the voltage between said first and second bus.

9. An integrated circuit according to claim 8 wherein all of said transistors are NPN transistors.

10. An integrated circuit according to claim 8 wherein said voltage $V_{CC}$ is less than $2V_{BE}$.

* * * * *